(12) United States Patent
Zhou et al.

(10) Patent No.: US 6,222,755 B1
(45) Date of Patent: *Apr. 24, 2001

(54) SOLID STATE HOLOGRAPHIC MEMORY

(75) Inventors: Gan Zhou, Abbadena; Xin An, Riverside; Fai Ho Mok, West Hills; Demetri Psaltis, Pasadena, all of CA (US)

(73) Assignee: Holoplex, Inc., Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/520,399

(22) Filed: Mar. 8, 2000

Related U.S. Application Data

(63) Continuation of application No. 09/327,146, filed on Jun. 7, 1999, now Pat. No. 6,055,174.

(51) Int. Cl.⁷ .......................... G11C 13/04; G11C 11/46
(52) U.S. Cl. .......................... 365/125; 365/126; 359/28; 359/32
(58) Field of Search .......................... 365/215, 216, 365/125, 126; 359/25, 28, 32

(56) References Cited

U.S. PATENT DOCUMENTS

| | | | |
|---|---|---|---|
| 5,007,690 | 4/1991 | Chern et al. | 365/125 |
| 5,661,577 | 8/1997 | Jenkins et al. | 359/11 |
| 5,754,318 | 5/1998 | Agopian | 365/125 |
| 5,859,808 | 1/1999 | Campbell et al. | 365/216 |
| 5,978,112 | 11/1999 | Psaltis et al. | 359/22 |
| 5,995,251 | 11/1999 | Hesselink et al. | 359/30 |
| 6,055,174 | * 4/2000 | Zhou et al. | 365/125 |
| 6,061,154 | * 5/2000 | Campbell et al. | 365/125 |

OTHER PUBLICATIONS

Feng Zhao and Koichi Sayano, "Compact read–only memory with lenses phase–conjugate holograms," Optics Letters, vol. 21, No. 16, pp. 1295–1297, Aug. 15, 1996.

\* cited by examiner

*Primary Examiner*—Son Mai
(74) *Attorney, Agent, or Firm*—Fliesler Dubb Meyer & Lovejoy LLP

(57) ABSTRACT

A method and a compact apparatus to read shift-multiplexed holograms on a storage medium without the need for any lenses, and without the need for moving the storage medium. The shift-multiplexed holograms have centers at different locations. The apparatus can generate an array of diverging spherical waves of reference beams, each for illuminating one of the holograms. Each hologram is read as an image on a detector array by illuminating that hologram with a corresponding diverging spherical wave of reference beam. Different holograms can be read by illuminating the medium with a different diverging spherical reference beam. The diverging beams can be from an array of sources, or can be from switching one source.

6 Claims, 8 Drawing Sheets

Change Signal Beam
Incidence Angle ~ 350

Translate
Reference Beam ~ 352

Change Data
in Data Mask ~ 354

SOLID STATE HOLOGRAPHIC MEMORY

This application is a continuation of U.S. patent application Ser. No. 09/327,146, filed Jun. 7, 1999, now U.S. Pat. No. 6,055,174.

BACKGROUND OF THE INVENTION

The present invention relates generally to a holographic read-only memory, and more particularly to a compact holographic read-only memory that does not need to have any movable parts.

Optical storage systems have a number of distinct advantages over magnetic storage systems. For example, they have higher storage capacity than magnetic storage systems. Also, data access is done optically, without the need for contact.

One approach to access data optically is based on CD-ROMs and DVDs. Even movies are now available in these formats. Unfortunately, they have a number of weaknesses. For example, to access data, disks are typically spun around. The need for moving the disks before data can be accessed reduces data-access speed, and increases power consumption.

Another approach is based on holographic optical disks. They offer much higher storage capacity than the compact discs. However, again they have to rely on moving or spinning the disks, reducing data-access speed and increasing power consumption.

A third option is based on optical RAMs, as discussed in U.S. Pat. No. 5,696,714. An optical RAM is a non-holographic optical memory, with an array of imaging optics integrated on top of a storage medium. Fabricating such integrated optical devices, with imaging optics on top of a storage medium, can be both difficult and expensive.

It should be apparent from the foregoing that there is still a need for an apparatus and method to access information optically, with higher storage capacity than compact disks, lower power consumption than existing optical disks, and simpler manufacturing processes than optical RAMs.

SUMMARY

The holographic memory systems and methods provided by the present invention can be very compact, with high storage capacity and low power consumption. It can be also relatively easy to manufacture, without even the need for any lenses in the system.

In one embodiment, the holographic memory system for reading holograms includes a holographic storage medium with a number of shift-multiplexed holograms, a detector array to read the holograms, and an array of light sources, each generating a diverging reference beam for illuminating one of the holograms. In this embodiment, each hologram can be read as an image on the detector array by illuminating the hologram with one of the diverging reference beams. Thus, to read different holograms, this embodiment does not need any lenses, and the storage medium does not have to be moved.

In another embodiment, the holographic memory system for recording shift-multiplexed holograms includes a holographic storage medium for recording the holograms, a data mask, an array light sources, and a converging signal beam. Each light source generates a converging reference beams for illuminating an area of the storage medium. The converging signal beam can be tilted to cover different areas on the storage medium. In this embodiment, each hologram is created through illuminating an area of the storage medium by both the converging signal beam and one of the converging reference beams. Before the signal beam converges to that area, it propagates through the data mask, which stores data of the corresponding hologram electronically.

In the above embodiments, holograms are read through diverging reference beams, and recorded through converging beams. Another embodiments can be with converging reference beams for reading holograms, and diverging reference beams for recording holograms. The reference beams are non-plane waves, and can be spherical waves or cylindrical waves.

Since different holograms can be accessed by activating different reference beams, the information access speed of the present invention can be very high. Also, since there is no need for mechanically moving the holographic medium to gain access to information in different holograms, the power consumption can be very low. Thus, the present invention can have very fast access speed, very low power consumption, and can also be relatively easy to manufacture.

Note that the language used in the specification has been principally selected for readability and instructional purposes, and may not have been selected to delineate or circumscribe the inventive subject matter. Also, the features and advantages described in the specification are not all-inclusive. Other aspects and advantages of the present invention will become apparent to one of ordinary skill in the art, in view of the specification, which illustrates by way of example the principles of the invention.

Same numerals in FIGS. 1–8 are assigned to similar elements in all the figures. Embodiments of the invention are discussed below with reference to FIGS. 1–8. However, those skilled in the art will readily appreciate that the detailed description given herein with respect to these figures is for explanatory purposes as the invention extends beyond these limited embodiments.

DETAILED DESCRIPTION OF THE INVENTION

Figure 1:
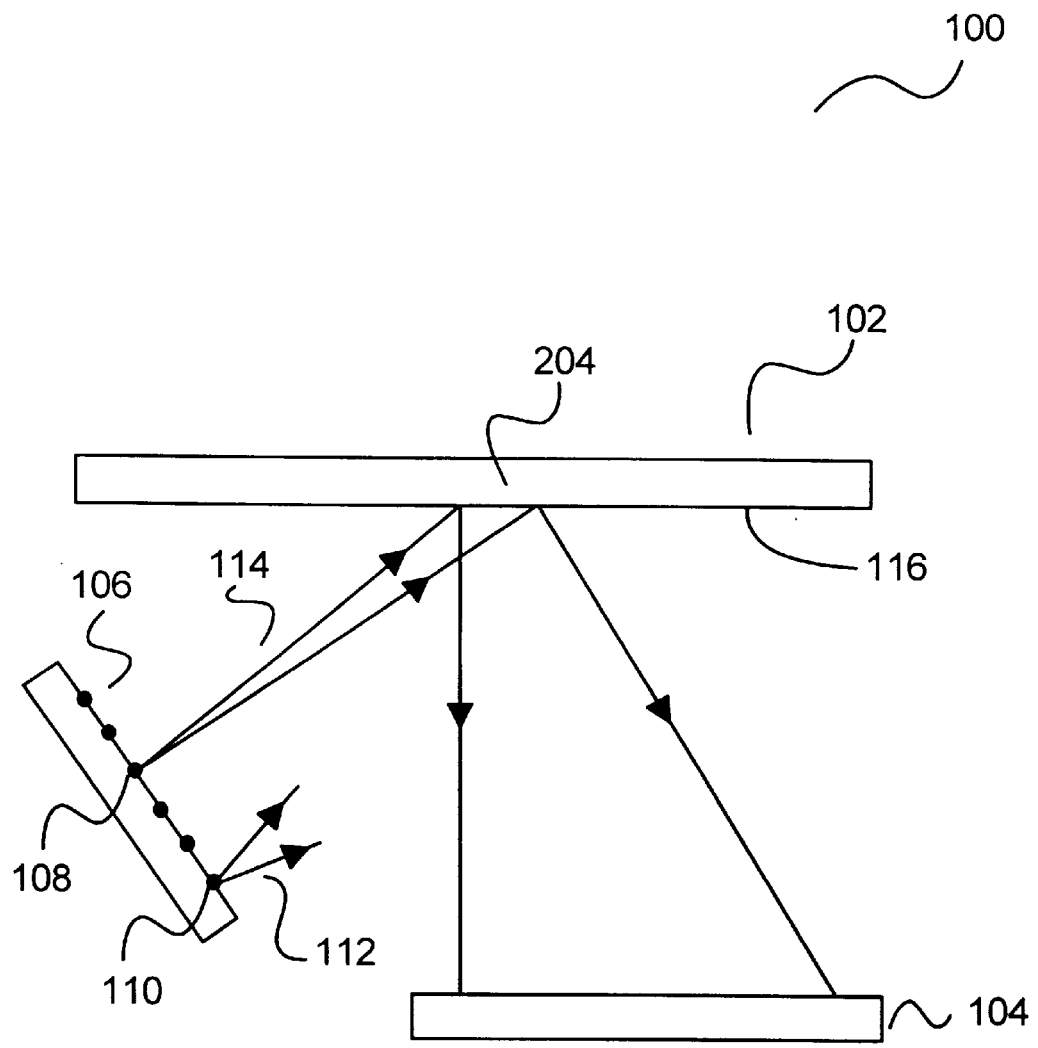
FIG. 1 shows one embodiment of the invention to access information from a holographic storage medium.
Figure 2:
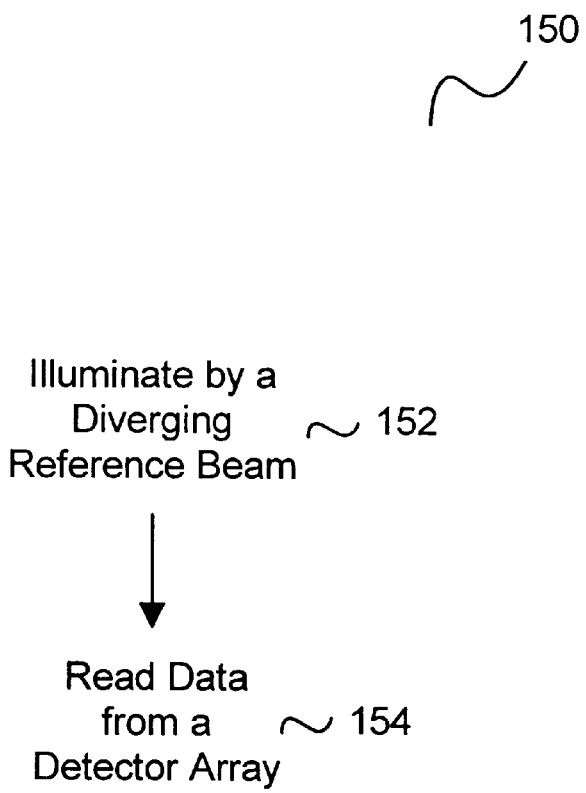
FIG. 2 illustrates one set of steps of the invention to access information from a holographic medium.
Figure 3:
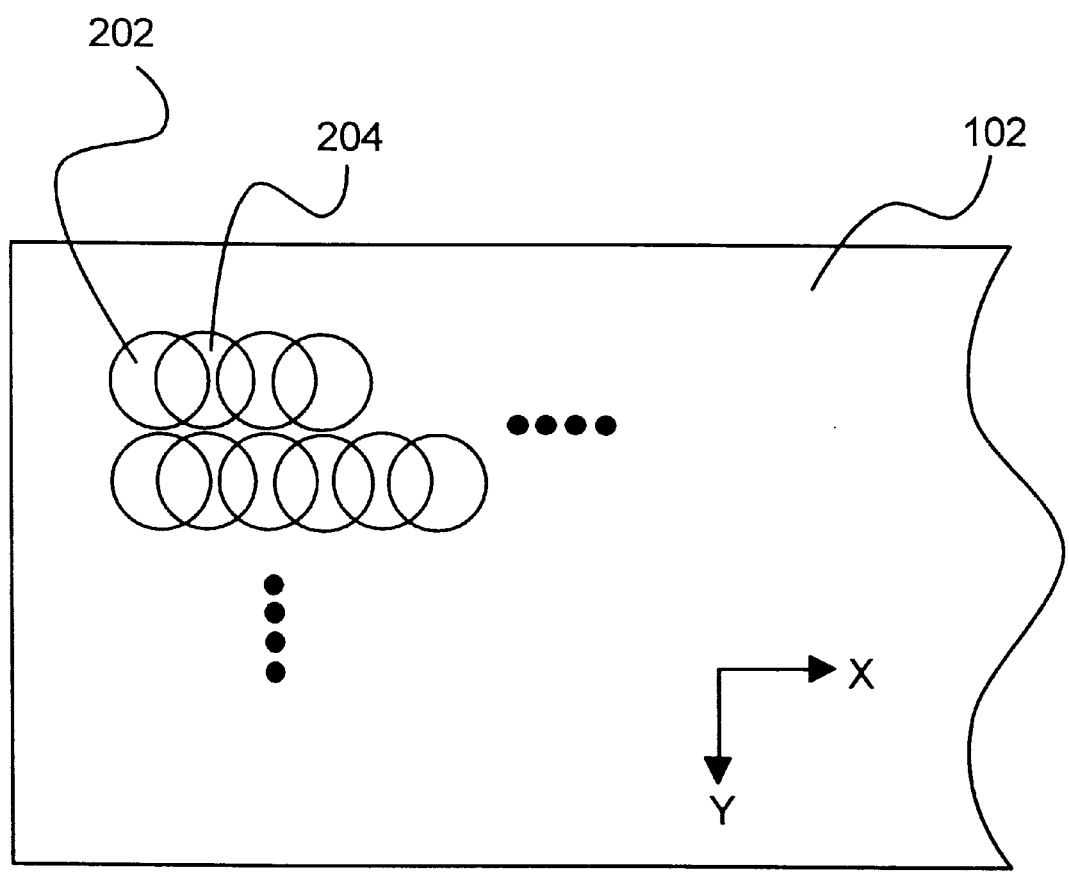
FIG. 3 shows examples of shift multiplexed holograms in the invention.

FIG. 1 shows one embodiment, 100, of the invention to access information by a set of steps, 150, shown in FIG. 2, from a holographic storage medium, 102, with shift-multiplexed holograms, for example, as shown in FIG. 3.

The medium can be a slab. The center of each hologram is at a different location from other holograms, such as holograms 202 and 204. Each hologram can contain one page of two-dimensional data bits.

The embodiment, 100, also includes a detector array, 104, for reading the holograms, and an array of sources 106, such as 108 and 110. Each of the sources can generate a diverging spherical waves of reference beams, such as 112 and 114, for illuminating one of the holograms. As an example, the source 108 generates a diverging beam 114 to illuminate the hologram 204.

The shift-multiplexed holograms shown in FIG. 3, can be based on a hybrid shift and spatial multiplexing technique. In FIG. 3, the X axis is in the plane of incidence of the illumination beams, and the Z axis, not shown, is along the thickness direction of the medium. As shown in the figure, the holograms are partially overlapping along the X-axis. However, along the Y-axis, the holograms are substantially non-overlapping to minimize cross-talk among themselves and maximize their diffraction efficiency. In one embodiment, the amount of overlap in X-axis is determined by the shift-selectivity, which is a function of medium thickness and the distance of the light sources to the medium. Decreasing the amount of overlap between holograms will reduce the storage density, but can improve the diffraction efficiency of each hologram. Depending on the available dynamic range of the medium, the amount of spatial multiplexing along X-axis can be adjusted to optimize the performance of the information storage device.

To read an hologram, such as 204, it is illuminated by a diverging reference beam (Step 152). The reconstructed hologram emerges from the medium and propagates to the detector array 104, which converts the optical signals into electrical signals (Step 154). To read another hologram, another light source is turned on, such as 110. The reconstructed hologram again propagates to the detector array. Thus, each hologram can be read as an image on the detector array, 104, by illuminating that hologram with a corresponding diverging spherical wave of reference beam.

Conventionally, there is a complicated lens system between the holograms and the detector array to image the holographic beams onto the detector array. In the present invention, as illustrated in FIG. 1, the holograms can be read without the need for any lenses between the holographic medium and the detector array.

Also, in conventional systems, to read multiple shift-multiplexed holograms, the storage medium has to be moved, either laterally or rotationally. In the present invention, as described above, different holograms can be read by just having different diverging beams illuminating the medium. Thus, the storage medium does not have to be moved to read different holograms, nor is it necessary to move the detector array. This significantly reduces the amount of power consumption and the need for complicated mechanical systems to read the holograms. Also, data access from the invented system can be much faster than conventional systems.

In the above example, the holographic storage medium, 102, includes a surface 116 that faces the detector array, 104. Also, the array of diverging spherical waves, such as 112 and 114, illuminates the same surface 102. The entire structure can be very compact.

Figure 4:
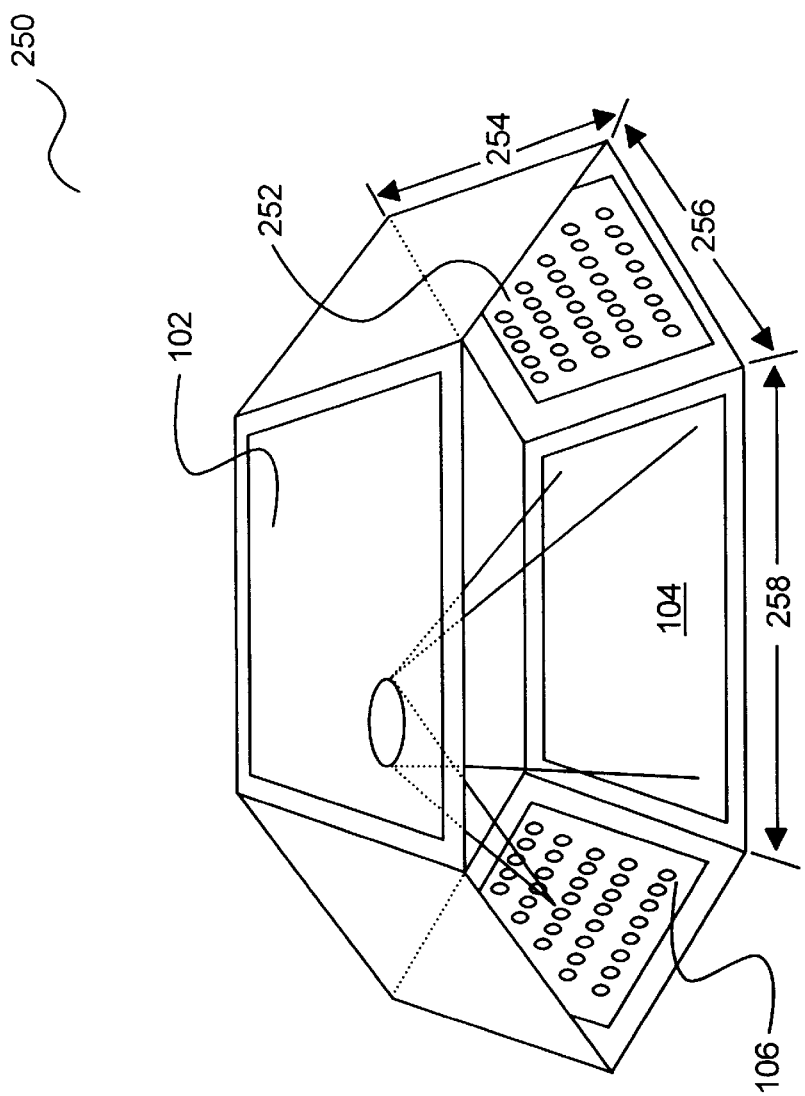
FIG. 4 shows an example of a structure for one embodiment of the invention to access information from a holographic storage medium.

FIG. 4 shows another embodiment, 250, of the present invention illustrating an embodiment of a compact read-only memory. It is in an hexagonal-shape, including six surfaces, and two light source arrays, 106 and 252. The top and bottom middle surfaces hold the storage medium 102, and the detector array 104, respectively. The two light source arrays, 106 and 252, are located on the two bottom surfaces, adjacent to the bottom middle surface. Each of the light source arrays is for reading half of the stored holograms. As shown in the figure, one of the light sources illuminates a hologram in the storage medium 102. The reconstructed hologram propagates to the detector array 104. The storage medium can be held in a cartridge to allow the medium to be easily inserted and removed from the system.

In one embodiment, the dimensions of an embodiment shown in FIG. 4 can be as follows:

The distance between the top and bottom middle surfaces is about 6 mm.

The width 254 of each surface is about 12 mm.

The length 256 for each detector array is about 12 mm.

The length 258 for the detector array is about 12 mm.

Each light array includes about 5*100 sources.

The storage medium 102 can store about 1000 holograms.

Each hologram stores about 1 million bits.

In one embodiment, the storage medium is made of a non-volatile holographic recording material with sufficient optical quality, dynamic range and thickness. Different types of materials are applicable, such as photosensitive glass, holographic photopolymers, and photorefractive crystals, exemplified by $LiNbO_3$.

In another embodiment, the light sources should be substantially of one frequency, with a coherence length greater than the thickness of the storage medium, which in one embodiment is about 1 mm. The spatial mode of each light source should be substantially identical across the array.

There are different ways to generate the array of diverging spherical waves of reference beams. One way is to use a Vertical Cavity Surface Emitting Laser or VCSEL array. Another is to use an incoherent light emitting diode or LED array and an interference filter to narrow the linewidth of the light source. A third approach is to use an incoherent light source array, and a sufficiently thick storage medium (such as 3 mm) to act as a color light filter to narrow the linewidth of the light sources. A fourth approach is to use a single laser source, such as a laser diode, and an electronic switch, which can direct the laser beam at different angles and spatial positions towards particular holograms. The electronic switch can be a micro-electro-mechanical-system (MEMS) switch. Methods to integrate such electronic switches to the sources should be obvious to those skilled in the art, and will not be further described.

The detector array can be charge coupled devices, or CMOS detectors, coupled to analog-to-digital converters. One embodiment further includes a decoder to implement error correction and other functions. Both the converters and the decoder can be on the detector array integrated circuit.

Figure 5:
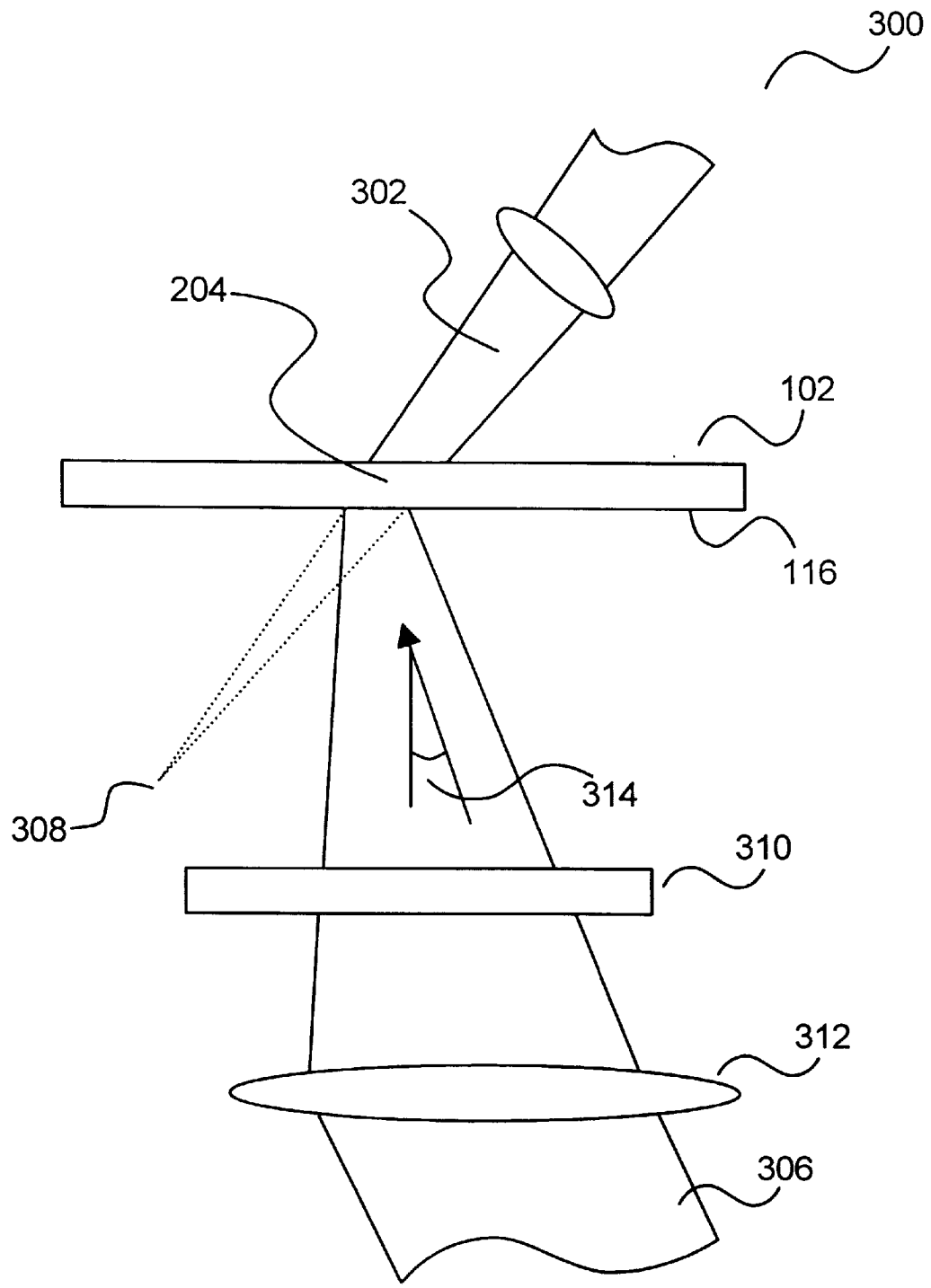
FIG. 5 shows an embodiment of the invention to record information to a holographic storage medium.
Figure 6:
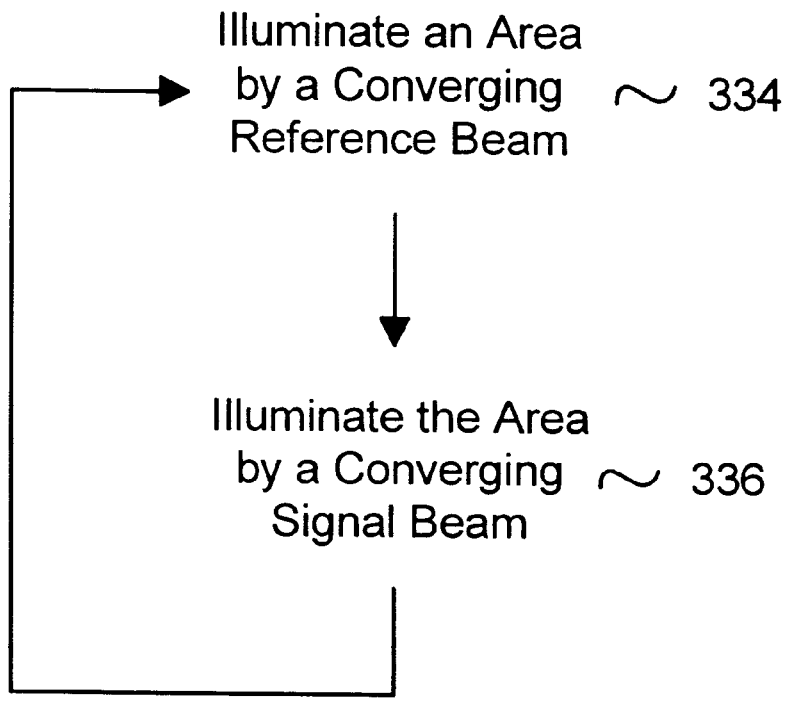
FIG. 6 shows one set of steps of the invention to record information to a holographic storage medium.

FIG. 5 shows an embodiment 300 of the invention to record the above holograms in the storage medium 102, using one set of steps shown in FIG. 6. In this embodiment, the hologram 204 is recorded by illuminating the corresponding area of the storage medium with a converging reference beam 302 (step 334) and a converging signal beam 306 (Step 336). For the reference beam, its point of convergence, 308, can be the location of the source generating the corresponding diverging spherical wave of reference beam to read that hologram. In one embodiment, the signal beam is the fourier transform of a data mask, 310, which can be a spatial light modulator with a proper image displayed. Note that the fourier transform lens 312 converging the signal beam is before the data mask 310. In this embodiment, the data mask 310 and the detector array 104 face the same surface 116 of the storage medium 102.

The stored hologram can be read by placing a light source at the converged point 308, and a detector array at the position of the data mask. The hologram is illuminated by a diverging spherical wave, and the reconstructed signal beam will back-propagate to form an image at the detector array. This method of read-out can be referred to as the phase-conjugate read-out.

Figure 7:
FIG. 7 shows one approach in the present invention to record another hologram at another area on a storage medium.
Figure 7:

FIG. 7 shows one approach to record another hologram at another area on the storage medium of the embodiment 300. It is done by (a) changing (Step 350) the incidence angle, 314, of the signal beam, (b) translating (Step 352) the reference beam so that both beams converge to the other area, and (c) changing (Step 354) the data in the data mask. The hologram will be the image of the data in the data mask. One way to change the incident angle is by tilting the signal beam 306.

In the above embodiments, the reference beams for reading holograms can be diverging spherical waves, while the reference beams for recording holograms can be the phase conjugate of the reading beams, and can be converging spherical waves. In another embodiment, the reference beams for reading can be converging waves, while that for recording holograms can be diverging waves.

Figure 8:
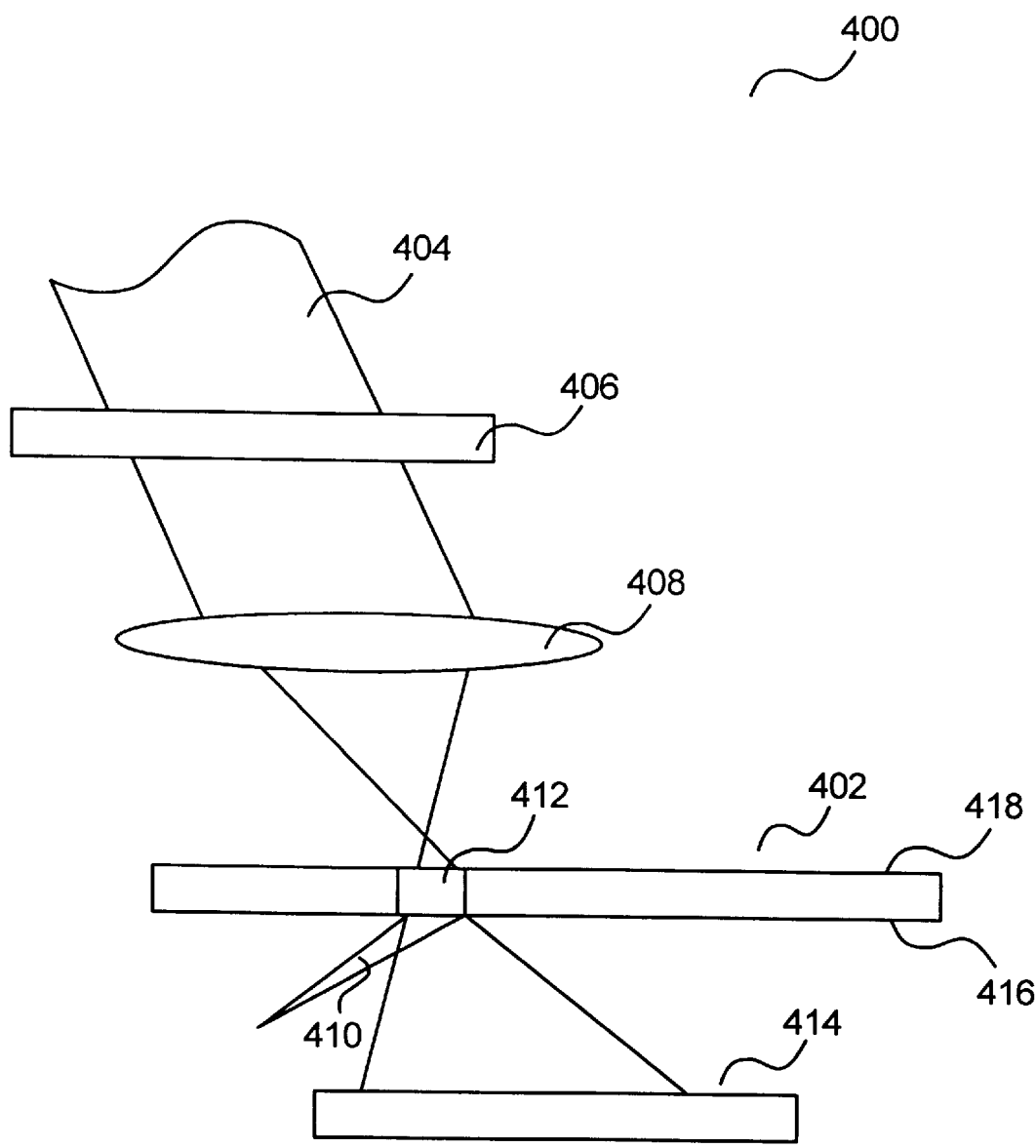
FIG. 8 shows another embodiment of the invention to record and to access information on a holographic storage medium.

FIG. 8 shows another embodiment 400 of the invention to record and to access information on a storage medium 402. In this embodiment, a signal beam 404 illuminates a data mask 406 and then is converged to an area on the storage medium by a lens 408. To record a hologram 412 at the area, a diverging reference beam 410 illuminates the same area. The hologram 412 can be read by the same embodiment shown in FIG. 1. This can be done, for example, by illuminating the hologram 412 with the diverging reference beam 410. A detector array 414 positioned at the image plane of the data mask reads out the hologram. In this example, the data mask 406 faces a surface, 418, of the storage medium that is opposite to the surface, 416, the detector array 414 faces.

In the above embodiments, the reference beams can be spherical waves. In other embodiments, the reference beams can be non-plane waves, and can be cylindrical waves.

In the embodiments shown in FIGS. 1 and 5, in one approach, the reading reference beams are phase conjugates of corresponding recording reference beams, and the detector array 104 is located substantially at the same area as the data mask 310. In one embodiment, the data mask includes many pixels with one pixel per data bit, and with each pixel having a corresponding detector in the detector array. In this embodiment, the data mask and the detector array are located at substantially the same area when the location of each pixel of the data mask differs by less than ¼ of a pixel size from the location of its corresponding detector in the detector array.

In the embodiment shown in FIG. 8, in one approach, the reading reference beams can be the same as the corresponding recording reference beams, and the detector array 414 is located substantially at the area of the image position of the data mask 406. Again, in one embodiment, substantially the same area means that the image position of each pixel of the data mask differs by less than ¼ of a pixel size from the position of its corresponding detector in the detector array.

As described above, the information access speed of the present invention can be very high because one can access different holograms by activating different reference beams. There is no need for mechanically moving the holographic medium, to gain access to information in different holograms. This is not just beneficial to the speed of operation, but also to the power required to operate the corresponding apparatus, since the power required to turn on and off different reference beams is typically much less than that required to move the medium. Thus, the present invention can have very fast access speed, very low power consumption, and can also be relatively easy to manufacture.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

What is claimed is:

1. A holographic memory apparatus for reading holograms comprising:

a holographic storage medium with a plurality of holograms;

a detector array for reading the plurality of holograms; and an array of reference beams, each for illuminating one of the holograms;

such that each hologram can be read as an image on the detector array by illuminating the hologram with a corresponding reference beam, without the need for moving the storage medium.

2. A holographic memory apparatus as recited in claim 1 wherein each hologram can be read as an image on the detector array without the need for any lenses.

3. A holographic memory apparatus for recording a plurality of holograms, the apparatus comprising:

a holographic storage medium for storing the holograms;

a data mask;

a plurality of reference beams such that each beam illuminates an area of the storage medium; and a converging signal beam, which can be tilted to cover different areas of the storage medium;

such that each hologram can be created by:
illuminating an area of the storage medium by one of the reference beam; and
illuminating by the signal beam, which converges to that area of the storage medium after propagating through the data mask, storing data of the corresponding hologram electronically.

4. A method to read from a holographic storage memory comprising the steps of:

illuminating on the holographic storage medium an area that includes a hologram by one of a plurality of reference beams to generate an image on a detector array; and reading data from the detector array;

such that:
the holographic storage medium includes a plurality of holograms, with each of the reference beams configured to illuminate one of the holograms to read the hologram;
the holograms can be read without the need for moving the storage medium.

5. A method as recited in claim 4 wherein each hologram can be read as an image on the detector array without the need for any lenses.

6. A method to record a plurality of holograms to a holographic storage medium, the method comprising the steps of:

illuminating an area of the storage medium by one of a plurality of reference beams which illuminates an area of the storage medium; and illuminating by a signal beam, which converges to that area of the storage medium after propagating through a data mask, which stores data of a hologram electronically, so as to record the hologram in the area; and repeating from the step of illuminating an area by having another reference beam illuminating another area of the storage medium;

tilting the signal beam to converge to the other area of the storage medium; and having the data mask storing another set of data of a hologram electronically;

so as to record the hologram in the other area.

* * * * *